(12) United States Patent
Hsieh (10) Patent No.: US 10,680,140 B2
(45) Date of Patent: Jun. 9, 2020

(54) LIGHT-EMITTING DEVICE AND MANUFACTURING METHOD THEREOF

(71) Applicant: Epistar Corporation, Hsinchu (TW)

(72) Inventor: Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/805,876

(22) Filed: Nov. 7, 2017

(65) Prior Publication Data

US 2018/0062046 A1    Mar. 1, 2018

Related U.S. Application Data

(63) Continuation of application No. 14/174,233, filed on Feb. 6, 2014, now Pat. No. 9,842,969.

(30) Foreign Application Priority Data

Feb. 8, 2013   (TW) ............................. 102105539 A
Aug. 22, 2013  (TW) ............................. 102130182 A (51) Int. Cl.
*H01L 33/62*     (2010.01)
*H01L 33/48*     (2010.01)
(Continued)

(52) U.S. Cl.
CPC ............ *H01L 33/483* (2013.01); *H01L 24/97* (2013.01); *H01L 33/641* (2013.01); *H01L 33/58* (2013.01);
(Continued)

(58) Field of Classification Search
CPC . H01L 33/00–648; H01L 25/075–0756; F21K 9/23–238
See application file for complete search history.

(56) References Cited

U.S. PATENT DOCUMENTS 4,975,814  A    12/1990  Schairer
5,814,870  A     9/1998  Schairer
(Continued)

FOREIGN PATENT DOCUMENTS

CN    102544320 A    7/2012
JP    2009-4698 A    1/2009
(Continued)

*Primary Examiner* — Eric A. Ward
(74) *Attorney, Agent, or Firm* — Muncy, Geissler, Olds & Lowe, P.C.

(57) ABSTRACT

A light-emitting device comprises a transparent substrate, an LED die on the transparent substrate, a second substrate on the LED die, and two electrode pins located between the transparent substrate and the second substrate. The LED die comprises a first surface, a second surface opposite to the first surface, and two electrodes located on the first surface, wherein the LED die is enclosed by the transparent substrate and the second substrate, and the two electrodes of the LED die respectively connect to the two electrode pins without a wire bonding process. Each of the two electrode pins comprises a first end and a second end opposite to the first end, and the first end is sandwiched by the LED die and the second substrate, and the second end extends out of the transparent substrate and the second substrate; wherein the first surface comprises a side and the two electrode pins extend in parallel from the side of the LED die toward a same direction away from the side.

17 Claims, 11 Drawing Sheets

(51) Int. Cl.
*H01L 33/64* (2010.01)
*H01L 23/00* (2006.01)
*H01L 33/58* (2010.01)

(52) U.S. Cl.
CPC .... *H01L 33/64* (2013.01); *H01L 2224/48091* (2013.01); *H01L 2224/48247* (2013.01); *H01L 2924/00* (2013.01); *H01L 2924/00014* (2013.01); *H01L 2924/12041* (2013.01); *H01L 2933/0033* (2013.01)

(56) References Cited

U.S. PATENT DOCUMENTS

| | | | |
|---|---|---|---|
| 6,310,364 B1 | 10/2001 | Uemura | |
| 6,350,625 B1 | 2/2002 | Cohen | |
| 6,396,082 B1 | 5/2002 | Fukasawa | |
| 6,486,561 B1 | 11/2002 | Fuwausa | |
| 6,661,167 B2 | 12/2003 | Eliashevich | |
| 7,011,432 B2 | 3/2006 | Chen | |
| 7,049,746 B2 | 5/2006 | Mano | |
| 7,872,277 B2 | 1/2011 | Hsu | |
| 8,008,845 B2 | 8/2011 | Van de Ven | |
| 8,071,997 B2 | 12/2011 | Scotch | |
| 8,337,048 B2 | 12/2012 | Shen | |
| 8,338,199 B2 | 12/2012 | Lerman et al. | |
| 2006/0157724 A1 | 7/2006 | Fujita | |
| 2008/0093607 A1 | 4/2008 | Feng | |
| 2009/0026484 A1 | 1/2009 | Hsu et al. | |
| 2009/0040418 A1 | 2/2009 | Kao | |
| 2010/0157598 A1* | 6/2010 | Tsai | F21V 19/0015 362/249.01 |
| 2011/0195532 A1 | 8/2011 | Lerman | |
| 2012/0074430 A1 | 3/2012 | Lee | |
| 2012/0138974 A1 | 6/2012 | Yoo | |
| 2012/0193650 A1* | 8/2012 | Cheng | F21K 9/90 257/88 |
| 2013/0099264 A1 | 4/2013 | Zimmerman et al. | |
| 2014/0124822 A1 | 5/2014 | Yan | |
| 2014/0209928 A1 | 7/2014 | Teng | |

FOREIGN PATENT DOCUMENTS

TW 201104912 A1 2/2011
TW 201244183 A1 11/2012

* cited by examiner

LIGHT-EMITTING DEVICE AND MANUFACTURING METHOD THEREOF

CROSS REFERENCE TO RELATED APPLICATIONS

This application is a Continuation of co-pending application Ser. No. 14/174,233 filed Feb. 6, 2014, for which priority is claimed under 35 U.S.C. § 120; and this application claims priority of Application No. 102105539 filed in Taiwan, R.O.C. on Feb. 8, 2013 and Application No. 102130182 filed in Taiwan, R.O.C. on Aug. 22, 2013 under 35 U.S.C. § 119; the entire contents of all of which are hereby incorporated by reference.

FIELD OF DISCLOSURE

The present disclosure relates to a light-emitting device and the manufacturing method thereof.

BACKGROUND OF THE DISCLOSURE

Figure 1A:
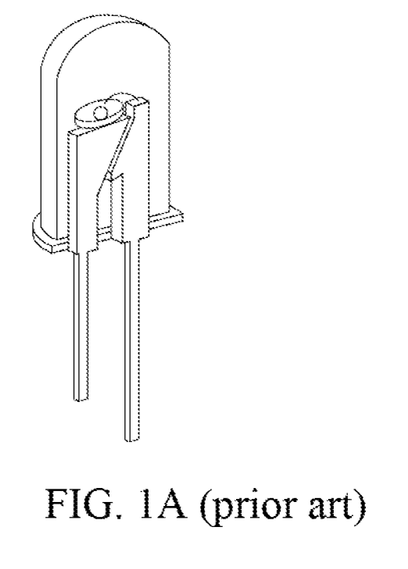
FIG. 1A shows a traditional LED package.
Figure 1B:
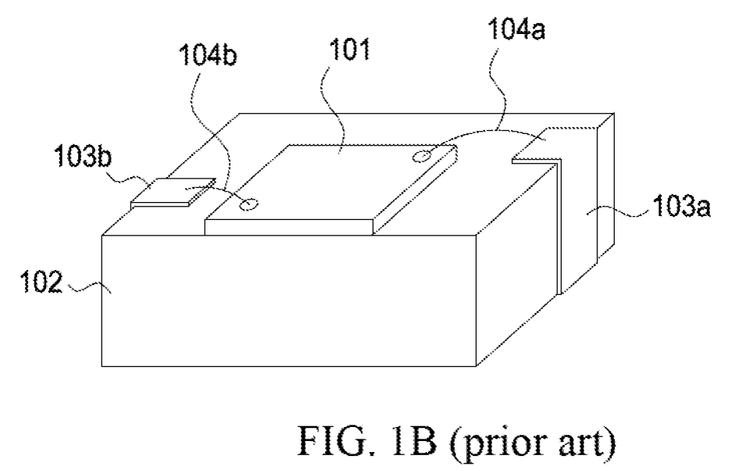
FIG. 1B shows a traditional light-emitting device with heat dissipation design.

Light-emitting diode (LED) is suitable for diverse lighting applications because it has good opto-electrical characteristics of low power consumption, low heat generation, long life, shock tolerance, compact, swift response, and emitting wavelength stability. As the LED development trend heads for a high power application, the operation temperature of LED device is increased as well. FIG. 1A shows a traditional LED package whose luminous efficiency is decreased when it is operated under a high power application because of poor heat dissipation. FIG. 1B shows an LED device having an LED die 101 disposed on a heat sink 102 and electrically couple to two electrodes 103a, 103b through bonding of wires 104a, 104b. This design is cost ineffective for relying on the heat sink to dissipate heat and the wire bonding process. Besides, the light field is poor in horizontal direction so additional optical lens is required to improve the uniformity of the light field in horizontal direction. Therefore, cost and the dimension or the thickness of the device are increased and become a problem for applications.

SUMMARY OF THE DISCLOSURE

One aspect of the present disclosure provides a light-emitting device comprising: a transparent substrate; an LED die on the transparent substrate, and the LED die comprising a first surface, a second surface opposite to the first surface, and two electrodes located on the first surface; a second substrate on the LED die, wherein the LED die is enclosed by the transparent substrate and the second substrate; and two electrode pins located between the transparent substrate and the second substrate, wherein the two electrodes of the LED die respectively connect to the two electrode pins without a wire bonding process, and each of the two electrode pins comprises a first end and a second end opposite to the first end, and the first end is sandwiched by the LED die and the second substrate, and the second end extends out of the transparent substrate and the second substrate; wherein the first surface comprises a side and the two electrode pins extend in parallel from the side of the LED die toward a same direction away from the side.

Another aspect of the present disclosure provides a light-emitting device comprising: a transparent substrate; an LED die on the transparent substrate, and the LED die comprising a first surface, a second surface opposite to the first surface, and two electrodes located on the first surface; a second substrate on the LED die, wherein the LED die is enclosed by the transparent substrate and the second substrate; and two electrode pins located between the transparent substrate and the second substrate, wherein the two electrodes of the LED die respectively connect to the two electrode pins, and each of the two electrode pins comprises a first end and a second end opposite to the first end, and the first end is sandwiched by the LED die and the second substrate, and the second end extends out of the transparent substrate and the second substrate; wherein the first surface comprises a side and the two electrode pins extend in parallel from the side of the LED die toward a same direction away from the side, and the electrode pins cross the side of the LED die.

Still another aspect of the present disclosure provides a light-emitting device comprising: a transparent substrate; an LED die on the transparent substrate, and the LED die comprising a first surface, a second surface opposite to the first surface, and two electrodes located on the first surface; a second substrate on the LED die, wherein the LED die is enclosed by the transparent substrate and the second substrate; and two electrode pins located between the transparent substrate and the second substrate, wherein the two electrodes of the LED die respectively connect to the two electrode pins, wherein each of the two electrode pins comprises a first end and a second end opposite to the first end, and the first end is sandwiched by the LED die and the second substrate, and the second end extends out of the transparent substrate and the second substrate; wherein the first surface comprises a side, and the two electrode pins extend in parallel from the side of the LED die toward a same direction away from the side.

DETAILED DESCRIPTION OF THE DISCLOSURE

Figure 2:
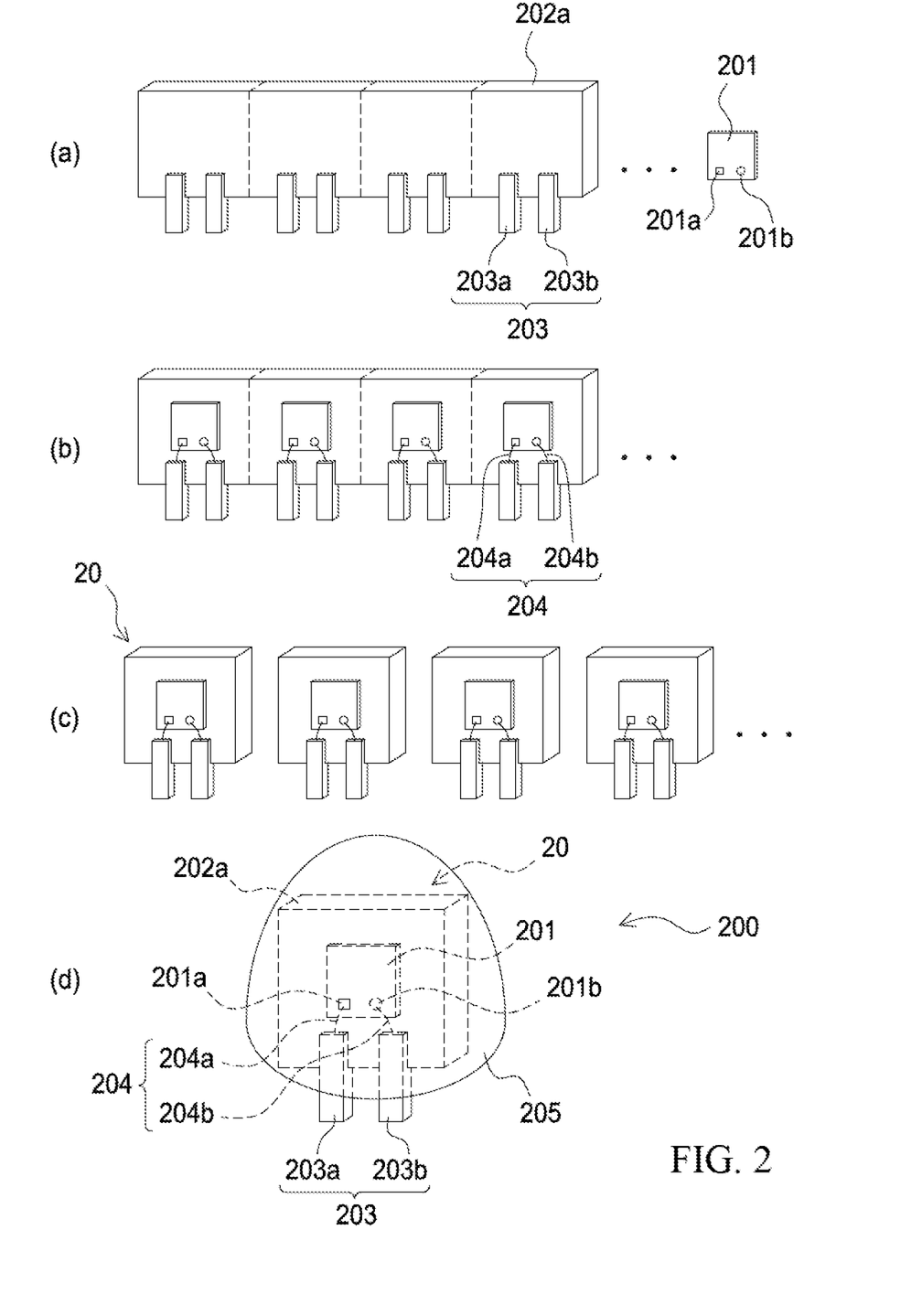
FIG. 2 shows a light-emitting device in accordance with a first embodiment of the present disclosure.

FIG. 2 shows a light-emitting device in accordance with the first embodiment of the present disclosure. As shown in FIG. 2(a), the method for forming the light-emitting device comprises providing a transparent substrate 202a wherein the transparent substrate 202a comprises a transparent material, for example, glass, sapphire($Al_2O_3$), CVD diamond, or aluminum nitride (AlN); forming multiple pairs of electrode pins 203 on the transparent substrate 202a wherein each pair of electrode pins 203 comprises two electrode pins 203a and 203b; and then as shown in FIG. 2(b), providing and adhering multiple LED dies 201 to the transparent substrate 202a through adhesive material, wherein each LED die 201 comprises two electrodes 201a and 201b and is separated from an corresponding pair of electrode pins 203a and 203b by a distance; providing multiple pairs of metal wires 204 wherein each pair of metal wires 204 comprises two metal wires 204a and 204b correspondingly connecting two electrodes 201a and 201b of each LED die 201 with electrode pins 203a and 203b; and then as shown in FIG. 2(c), cutting the transparent substrate 202a to form multiple light-emitting devices 20; and finally as shown in FIG. 2(d), encapsulating each light-emitting device 20 by a package material 205, for example, epoxy resin or silicone, wherein a phosphor material (not shown) is optionally dispersed in the package material 205. In one embodiment, the cutting step is performed after the encapsulating step. In one embodiment, multiple cavities (not shown) are optionally formed in the transparent substrate 202a and the LED dies 201 are disposed in the cavities correspondingly.

FIG. 2(d) shows the light-emitting device 200 in accordance with the first embodiment of the present disclosure. The light-emitting device 200 comprises a transparent substrate 202a wherein the transparent substrate comprises a transparent material, for example, glass, sapphire($Al_2O_3$), CVD diamond, or aluminum nitride (AlN); a pair of electrode pins 203 having two electrode pins 203a and 203b on the transparent substrate 202a; an LED die 201 on the transparent substrate 202a wherein the LED die 201 comprises two electrodes 201a and 201b and is separated from the two electrode pins 203a and 203b by a distance; a pair of metal wires 204 having two metal wires 204a and 204b correspondingly connected the two electrodes 201a and 201b of the LED die 201 with the two electrode pins 203a and 203b; and a package material 205, for example, epoxy resin or silicone encapsulating the device 20. That is, the package material 205 encapsulates the transparent substrate 202a, the LED die 201, the two electrode pins 203a and 203b, and the two metal wires 204a and 204b, and exposes part of the two electrode pins 203a and 203b. A phosphor material (not shown) is optionally dispersed in the package material 205. In addition, a cavity (not shown) is optionally formed in the transparent substrate 202a and the LED die 201 is disposed in the cavity correspondingly.

Figure 3:
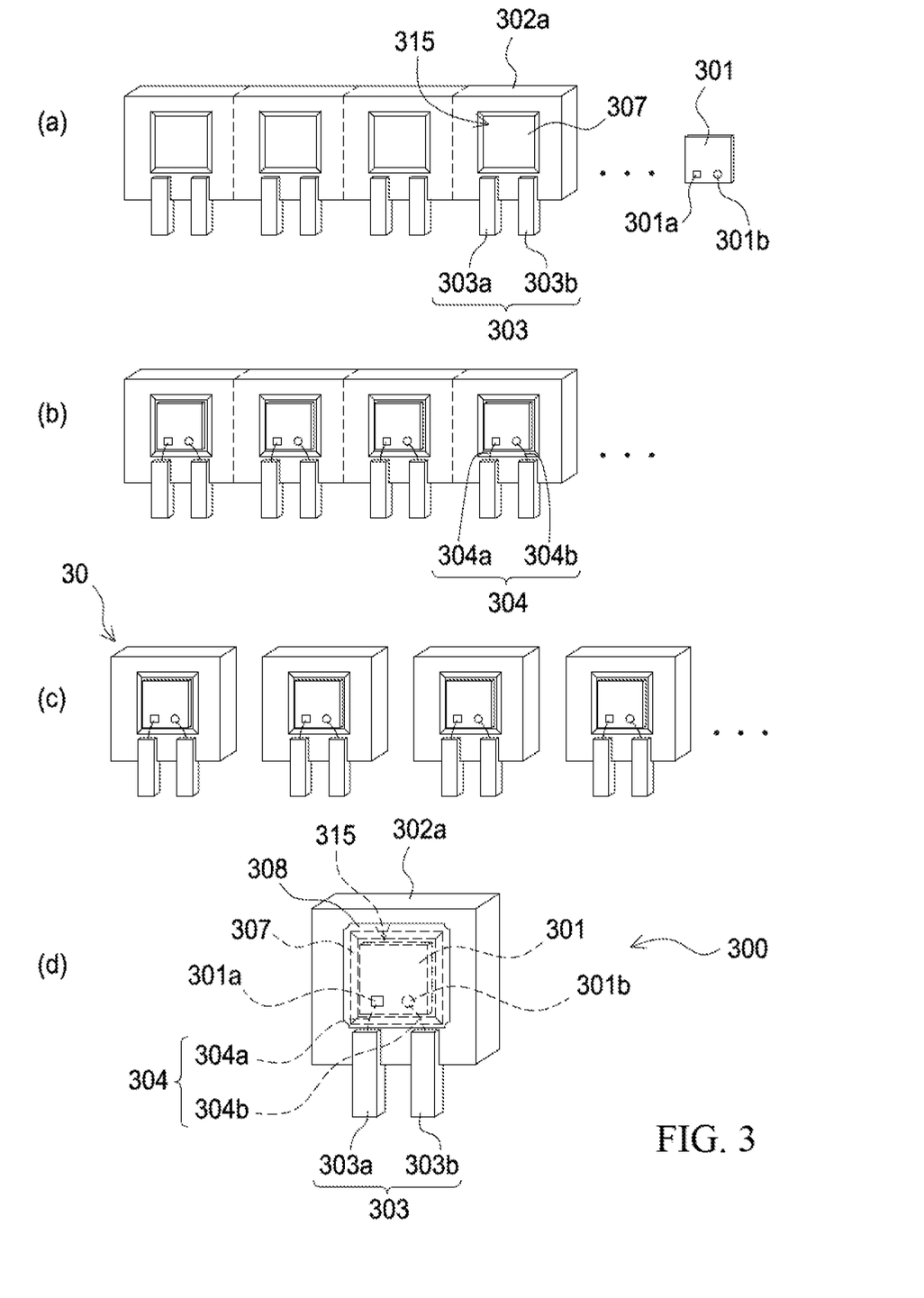
FIG. 3 shows a light-emitting device in accordance with a second embodiment of the present disclosure.

FIG. 3 shows a light-emitting device in accordance with the second embodiment of the present disclosure, which is modified from the first embodiment. As shown in FIG. 3(a), the method for forming the light-emitting device comprises providing a transparent substrate 302a wherein the transparent substrate 302a comprises a transparent material, for example, glass, sapphire($Al_2O_3$), CVD diamond, or aluminum nitride (AlN); forming multiple cavities 315 in the transparent substrate 302a; forming multiple pairs of electrode pins 303 on the transparent substrate 302a wherein each pair of electrode pins 303 comprises two electrode pins 303a and 303b; forming a phosphor layer 307 in the cavities 315 and on the sidewalls of the cavities 315 wherein the phosphor layer 307 comprises a phosphor material dispersed in a package material, for example, epoxy resin or silicone; providing and adhering multiple LED dies 301 to the transparent substrate 302a through adhesive material, wherein each LED die 301 comprises two electrodes 301a and 301b and is separated from the corresponding electrode pins 303a and 303b by a distance as shown in FIG. 3(b); providing multiple pairs of metal wires 304 wherein each pair of metal wires 304 comprises two metal wires 304a and 304b correspondingly connecting two electrodes 301a and 301b of each LED die 301 with the electrode pins 303a and 303b; and then as shown in FIG. 3(c), cutting the transparent substrate 302a to form multiple light-emitting devices 30; and finally encapsulating each LED die 301, cavity 315, and/or transparent substrate 302a by a package material 308. In one embodiment, because the phosphor layer 307 is formed between the transparent substrate 302a and the LED die 301, the package material 308 comprising the same phosphor material as that contained in the phosphor layer 307 is used to cover the exposed area of the LED die 301 such that the LED die 301 is fully covered by the package material 308. The package material 308 fully covers the opening of the cavity 315 in the present embodiment. A part of the difference between the present embodiment and the first embodiment is that the package material 308 is attached closely and smoothly to the transparent substrate 302a to cover the LED die 301. Therefore the device is thinned or the subsequent process, such as setting an optical device thereon is facilitated. In one embodiment, the cutting step is performed after encapsulating the package material 308 on the LED die 301.

The light-emitting device 300 in accordance with the second embodiment of the present disclosure comprises a transparent substrate 302a comprising a transparent material, for example, glass, sapphire($Al_2O_3$), CVD diamond, or aluminum nitride (AlN), wherein the transparent substrate 302a comprises a cavity 315; a phosphor layer 307 in the cavities 315 and on the sidewalls of the cavities 315; a pair of electrode pins 303 having two electrode pins 303a and 303b on the transparent substrate 302a; an LED die 301 on the transparent substrate 302a and in the cavity 315, wherein the LED die 301 comprises two electrodes 301a and 301b and is separated from the two electrode pins 303a and 303b by a distance; a pair of metal wires 304 having two metal wires 304a and 304b correspondingly connected the two electrodes 301a and 301b of the LED die 301 with the two electrode pins 303a and 303b; and a package material 308, for example, epoxy resin or silicone encapsulating the LED die 301, the cavity 315, and/or the transparent substrate 302a. A phosphor material (not shown) is optionally dispersed in the package material 308. The phosphor material contained in the package material 308 can be the same as that contained in the phosphor layer 307.

Figure 4:
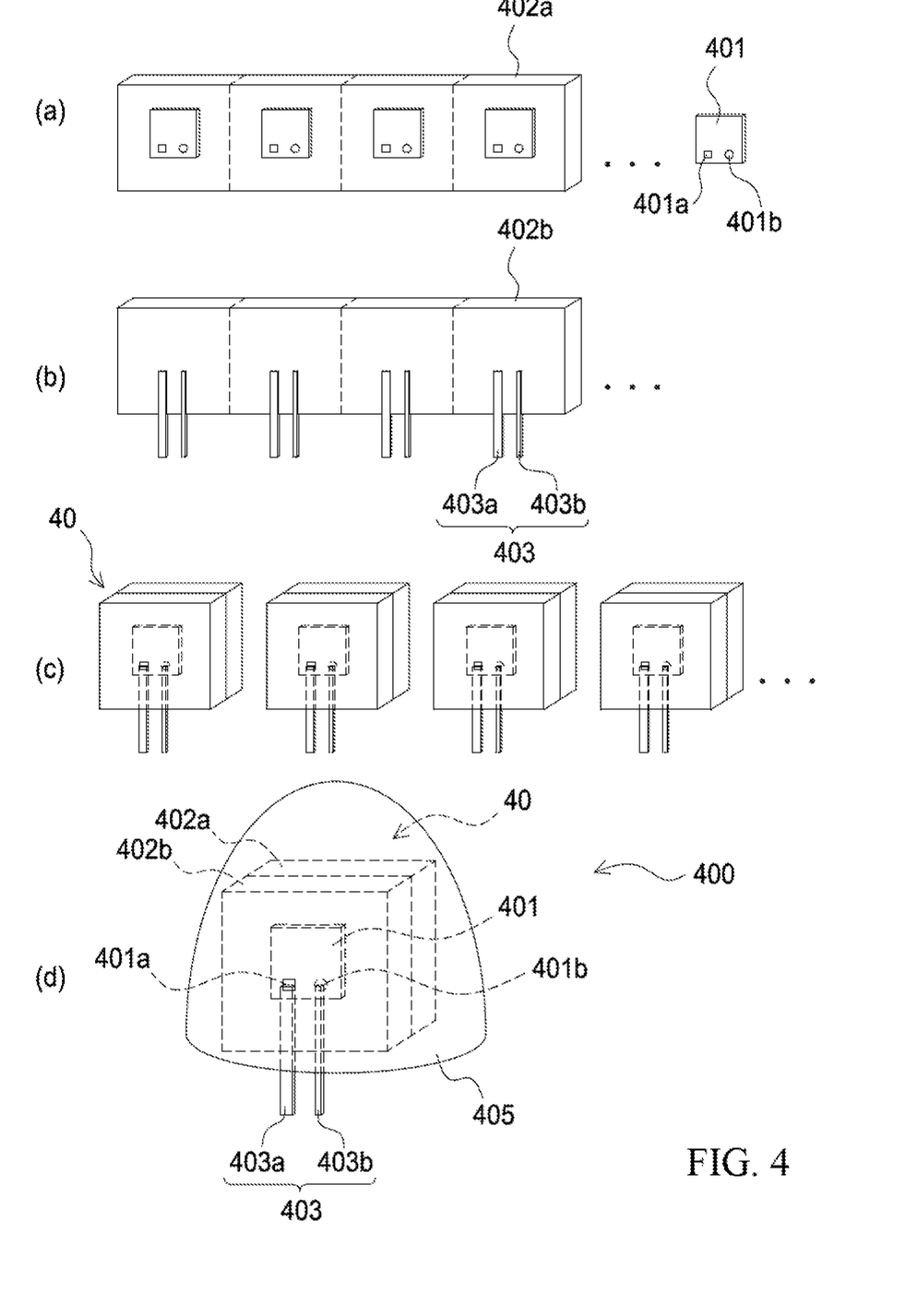
FIG. 4 shows a light-emitting device in accordance with a third embodiment of the present disclosure.

FIG. 4 shows a light-emitting device in accordance with the third embodiment of the present disclosure. As shown in FIG. 4(a), the method for forming the light-emitting device comprises providing a first transparent substrate 402a wherein the transparent substrate 402a comprises a transparent material, for example, glass, sapphire($Al_2O_3$), CVD diamond, or aluminum nitride (AlN); providing multiple LED dies 401 affixed to the first transparent substrate 402a, wherein each LED die 401 comprises two electrodes 401a and 401b; and then as shown in FIG. 4(b), providing a second transparent substrate 402b wherein the second transparent substrate 402b comprises a transparent material as illustrated above, and is the same as or different from that of the first transparent substrate 402a; forming multiple pairs of electrode pins 403 on the second transparent substrate 402b, wherein each pair of electrode pins 403 comprises two electrode pins 403a and 403b; and then as shown in FIG. 4(c), aligning and bonding the first transparent substrate 402a to the second transparent substrate 402b to bring the two electrodes 401a and 401b of each die 401 in contact with the two electrode pins 403b and 403a respectively; cutting the bonded first transparent substrate 402a and the second transparent substrate 402b to form multiple light-emitting devices 40; and finally as shown in FIG. 4(d), encapsulating each light-emitting device 400 by a package material 405, for example, epoxy resin or silicone. That is, the package material 405 encapsulates the bonded first transparent substrate 402a and the second transparent substrate 402b, and exposes a part of the electrode pins 403a and 403b. A phosphor material (not shown) is optionally dispersed in the package material 405. In one embodiment, multiple cavities are formed in the first transparent substrate 402a for the LED dies 401 to be disposed therein.

The light-emitting device 400 in accordance with the third embodiment of the present disclosure comprises a first transparent substrate 402a wherein the first transparent substrate 402a comprises a transparent material, for example, glass, sapphire($Al_2O_3$), CVD diamond, or aluminum nitride (AlN); a second transparent substrate 402b bonded to the first transparent substrate 402a comprising a transparent material, for example, glass, sapphire($Al_2O_3$), CVD diamond, or aluminum nitride (AlN); a pair of electrode pins 403 having two electrode pins 403a and 403b between the first transparent substrate 402a and the second transparent substrate 402b; and an LED die 401 between the first transparent substrate 402a and the second transparent substrate 402b comprising two electrodes 401a and 401b, wherein the two electrodes 401a and 401b of the LED die 401 is correspondingly connected with the two electrode pins 403a and 403b.

Figure 5:
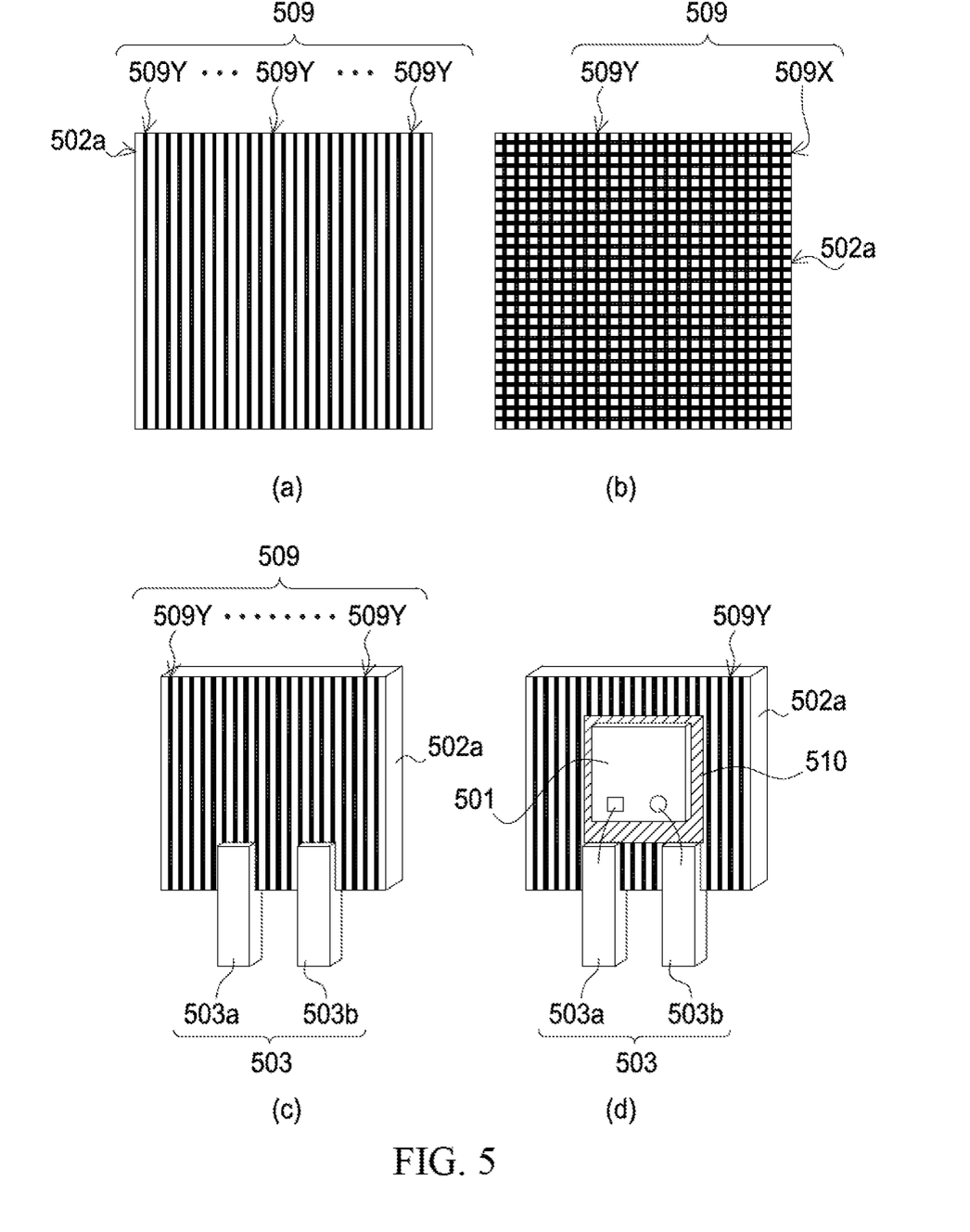
FIG. 5 shows a light-emitting device in accordance with a fourth embodiment of the present disclosure.

FIG. 5 shows a light-emitting device having a self-heat-dissipating structure in accordance with a fourth embodiment of the present disclosure. The light-emitting device according to the present embodiment combines the self-heat-dissipating structure with the light-emitting device illustrated in the foregoing first to third embodiments in order to improve the heat dissipation of the light-emitting device. The method for forming the light-emitting device comprises providing a transparent substrate 502a comprising a transparent material, wherein the transparent substrate 502a can be the same as or similar to anyone of the foregoing transparent substrate 202a, 302a, 402a, and 402b; forming a self-heat-dissipating layer 509 on the transparent substrate 502a wherein the self-heat-dissipating layer 509 comprises a transparent material with a high thermal conductivity greater than 100 W/mK, and optionally with a property of high thermal radiation for increasing the heat dissipation efficiency. The self-heat-dissipating layer 509 comprises electrically conductive material, for example, thin metal or ally, or a carbon-containing conductive material. The thin metal or ally comprises Sn, Al, Au, Pt, Zn, Ag, Ti, Pb, Cu, or Ni, or the alloy thereof. The carbon-containing conductive material comprises a conductive material with carbon composition near or equal to 100%, such as graphene. Another example of the self-heat-dissipating layer 509 comprises an electrically non-conductive material, for example, a carbon-containing electrically non-conductive material having a carbon composition near or equal to 100%, like diamond or diamond-like-carbon (DLC). The self-heat-dissipating layer 509 is a continuous layer covering the whole surface of the transparent substrate 502a. Another example of the self-heat-dissipating layer 509 is in the form of multiple stripes 509Y on the surface of the transparent substrate 502a by a lithographic-etching process as shown in FIG. 5(a). Still another example of the self-heat-dissipating layer 509 is in the form of cross-link pattern with multiple vertical stripes 509Y crossing multiple horizontal stripes 509X. Taking the first embodiment or the second embodiment as an example, the subsequent steps may be the same as those illustrated in these embodiments, such as forming multiple electrode pins 503a and 503b on the transparent substrate 502a as shown in FIG. 5(c), and the other following steps are carried out to complete the light-emitting device as shown in FIG. 5(d). It is noted that when the self-heat-dissipating layer 509 comprises an electrically conductive material, an insulating layer 510 is formed between the transparent substrate 502a and the LED die 501 for electrically insulating to prevent a short circuit. Conventional packaging techniques which try to find a heat dissipating solution in the fields of lead frame, wire bonding, or soldering are not effective. In contrast, the self-heat-dissipating layer integrated with the transparent substrate described in foregoing embodiments in the present disclosure provides the light-emitting device with excellent heat dissipation efficiency because of a greater heat dissipating area and a better heat dissipating mechanism such as both conduction and convection via air. Besides, when the self-heat-dissipating layer is conductive and in the form of multiple stripes 509Y as illustrated in FIG. 5(a), some of the stripes 509Y may be optionally contacted with the electrode pins 503a and 503b for providing an additional heat dissipating path through the electrode pins 503a and 503b. When the self-heat-dissipating layer 509 comprises an electrically non-conductive material, such as diamond, the self-heat-dissipating layer is free to be contacted with the electrode pins 503a and 503b without specifically considering in the pattern thereof, because there is no short circuit issue.

Figure 6:
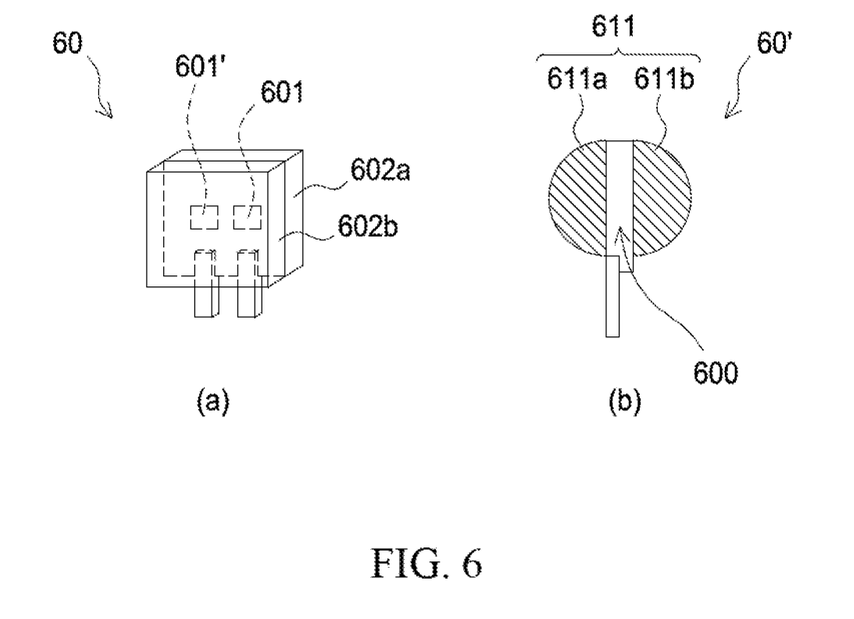
FIG. 6 shows a light-emitting device in accordance with a fifth embodiment of the present disclosure.

FIG. 6 shows a light-emitting device in accordance with the fifth embodiment of the present disclosure. The light-emitting device according to the present embodiment can be applied to the light-emitting device illustrated in the foregoing first to fourth embodiments. As shown in FIG. 6(a), the number of the LED dies in the light-emitting device illustrated in the foregoing embodiments can be adjusted to include two or more LED dies in the light-emitting device. For example, a blue LED die 601 and a red LED die 601' are set together in a light-emitting device. In particular, as illustrated in the second embodiment, cavities are formed in the transparent substrates 601a and 601b with phosphor materials coated therein for the blue LED dies 601 to accomplish a light-emitting device 60 which emits warm white light. Furthermore, as shown in FIG. 6(b), an optical device 611 comprising one or both of optical elements 611a, 611b may be formed on one or both sides of the transparent substrates of the light-emitting device 600 (a cross-sectional view). The light-emitting device 600 is the same as or similar to the light-emitting device as described in the second or third embodiments. The optical elements 611a and 611b comprise hemispheres on the opposite sides of the light-emitting device 600 for enhancing the light extraction efficiency of the light-emitting device 600.

Figure 7:
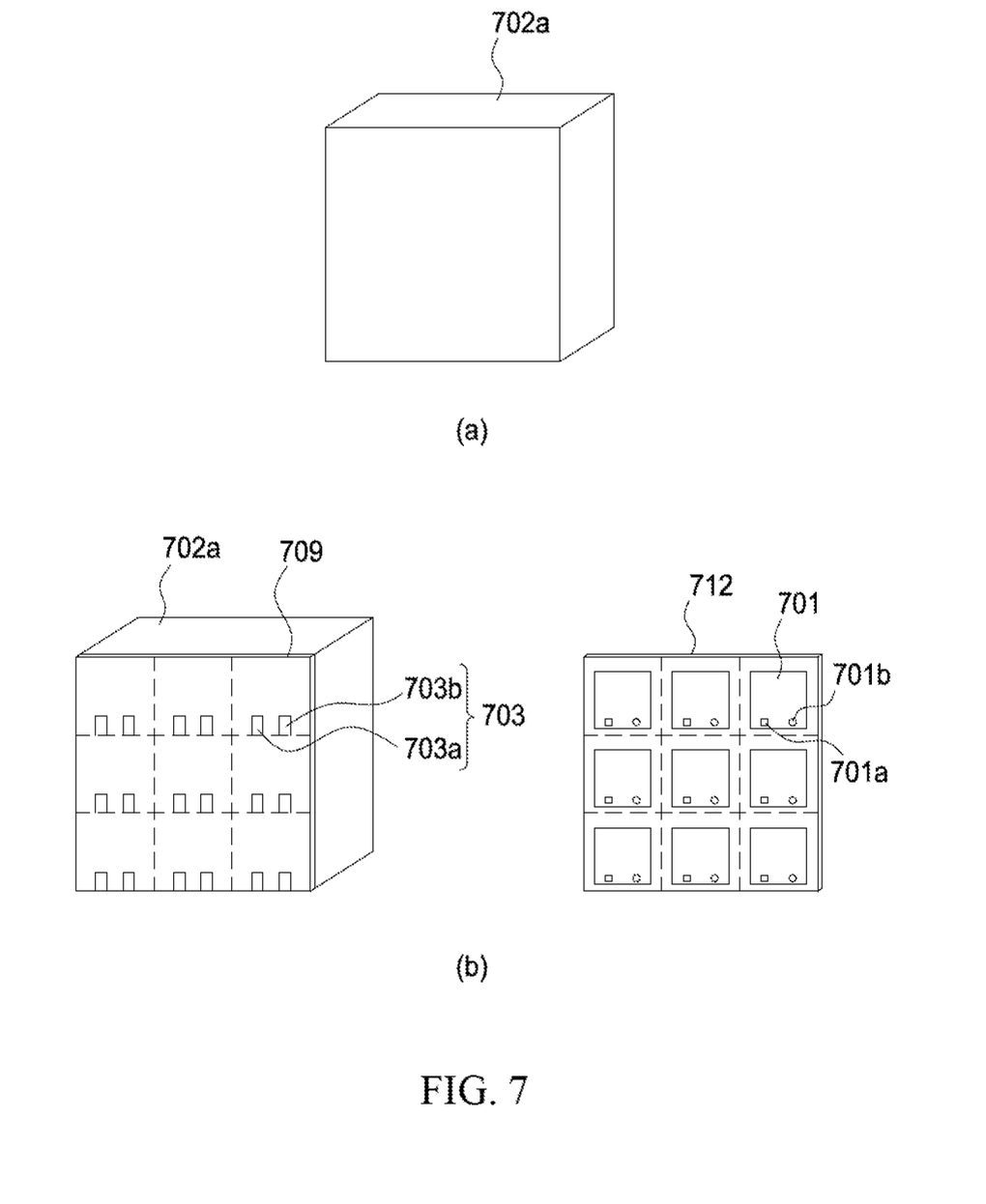
FIG. 7 shows a light-emitting device in accordance with a sixth embodiment of the present disclosure.

FIG. 7 shows a light-emitting device in accordance with a sixth embodiment of the present disclosure. As shown in FIG. 7(a), the method for forming the light-emitting device comprises providing a transparent substrate 702a wherein the transparent substrate 702a comprises a transparent material the same as or similar to the transparent substrate 202a described in the first embodiment; as shown in the left part of FIG. 7(b), forming a self-heat-dissipating layer 709 on the transparent substrate 702a wherein the self-heat-dissipating layer 709 comprises a transparent material with a high thermal conductivity greater than 100 W/mK and optionally with a property of high thermal radiation, and wherein the self-heat-dissipating layer 709 in the present embodiment comprises an electrically non-conductive material having a carbon composition near or equal to 100%, like diamond or diamond-like-carbon (DLC) to avoid the short circuit issue;

and forming multiple pairs of electrode pins 703 on the self-heat-dissipating layer 709 wherein each pair of electrode pins 703 comprises two electrode pins 703a and 703b. In one embodiment, the electrode pins 703a and 703b are formed by firstly sputtering or vapor depositing a metal layer and then patterning by lithographic-etching process. And then as shown in the right part of FIG. 7(b), the method further comprises providing multiple LED dies 701 on a substrate 712 wherein the substrate can be a blue tape in one embodiment; aligning the transparent substrate 702a to the substrate 712 to bring the two electrodes 701a and 701b of each LED die 701 in contact with the two electrode pins 703a and 703b respectively, and fixing each LED die 701 to the transparent substrate 702a, and then separating each LED die 701 from the substrate 712. When the substrate 712 is a blue tape, the substrate 712 can be lifted off and separated from the LED dies 701 by heating the blue tape to reduce its adhesion to the LED dies 701. The result is shown in FIG. 7(c). As shown in the left part of FIG. 7(d), the method further comprises cutting the transparent substrate 702a to which the LED dies 701 are fixed to form multiple light-emitting devices 70. And finally, as shown in the right part of FIG. 7(d), the method further comprises encapsulating each light-emitting device 70 by a package material 708, for example, epoxy resin or silicone to form a light-emitting device 700. A phosphor material (not shown) is optionally dispersed in the package material 708. In one embodiment, multiple cavities are optionally formed in the transparent substrate 702a for the LED dies 701 to be disposed therein. In another example, similar to the second embodiment and FIG. 3, the phosphor material is disposed in the cavities such that the LED die 701 is in the cavity and on the phosphor material.

FIG. 7(e) shows one embodiment of the light-emitting device 700 associated with a carrier 720. The carrier 720 comprises a base 721 and two terminals 722a and 722b fixed to the base 721 for external power source. The base 721 comprises a socket 723 for the light-emitting device 700 to be plugged in. Each of the two terminals 722a and 722b comprises an extension disposed in the cavity 723 to form two power supply pads 722a' and 722b'. When the light-emitting device 700 is plugged in the cavity 723, the two electrode pins 703a and 703b are respectively contacted with the two power supply pads 722a' and 722b' through which the external power source is provided to the light-emitting device 700 via the two power supply pads 722a' and 722b'. Further, the base 721 may be a heat sink comprising a high thermal conductive material. So in additional to the thermal dissipating path formed by the self-heat-dissipating layer 709 on the transparent substrate 702a as described in the fourth embodiment and FIG. 5, another thermal dissipating path is provided by the path formed by the contact of the self-heat-dissipating layer 709 with the two electrode pins 703a and 703b, the contact of the two electrode pins 703a and 703b with the two power supply pads 722a' and 722b', and the contact of the two power supply pads 722a' and 722b' with the base 721 when the two power supply pads are set in the socket 723. When the base 721 is designed to function as a heat sink, it provides a better thermal dissipation because of the aforementioned thermal dissipating path. In another embodiment, a heat dissipating path is formed by a direct contact of the self-heat-dissipating layer 709 with the base 721 while being plugged in the socket 723.

The light-emitting device 700 according to the present embodiment has characteristics such as being vertical type and plug-and-use. In addition to the advantage illustrated above, because of the characteristic as being vertical type, when the light-emitting device 700 is plugged into the socket 723, the LED die 701 is perpendicular to the upper surface S of the carrier 702 and therefore provides a greater heat dissipating area and better heat dissipation mechanisms, for example, both conduction and convection via the air, especially the advantage in heat dissipation through the self-heat-dissipating layer 709 set on the transparent substrate 702a. For a conventional LED die, the light-emitting diode is formed of a p-type semiconductor layer, an n-type semiconductor layer and an active layer between the p-type semiconductor layer and the n-type semiconductor layer. The major light-emitting surface is a surface perpendicular to the stacking direction of the p-type semiconductor layer, the active layer, and the n-type semiconductor layer. From the view of the emitting intensity, the intensity emitting from the lateral direction which is perpendicular to stacking direction is less than 20% of the total intensity from all directions of the LED die. In other words, the emitting intensity from the major light-emitting surface is greater than 80% of the total intensity or greater than 40% of the total intensity if light is emitted from two opposite surfaces of the LED die. In summary, the emitting intensity from the major light-emitting surface is at least greater than 30% of the total intensity of the LED die. In the present embodiment, the major light-emitting surfaces are the surfaces perpendicular to the stacking direction of the p-type semiconductor layer, the active layer, and the n-type semiconductor layer, or the major light-emitting surfaces are surfaces from each of which the emitting intensity is at least greater than 30% of the total intensity from all directions of the LED die. The major light-emitting surfaces of the LED die 701 is substantially perpendicular to the upper surface S of the carrier 720 so as to achieve a greater contact area with the ambient air and benefit heat dissipation. The plug-and-use characteristic saves the cost in wire bonding process and facilitates repairing.

The light-emitting device 700 as shown in the right part of FIG. 7(d) in accordance with the sixth embodiment of the present disclosure comprises a transparent substrate 702a wherein the transparent substrate 702a comprises a transparent material, for example, glass, sapphire($Al_2O_3$), CVD diamond, or aluminum nitride (AlN); a self-heat-dissipating layer 709 comprising a high thermal conductive material on the transparent substrate 702a; a pair of electrode pins 703 having two electrode pins 703a and 703b on the self-heat-dissipating layer 709; an LED die 701 on the transparent substrate 702a and on the self-heat-dissipating layer 709, wherein the LED die 701 comprises two electrodes 701a and 701b correspondingly connected with the two electrode pins 703a and 703b; and a package material 708, for example, epoxy resin or silicone encapsulating the device 70 to cover the LED die 701 and/or the transparent substrate 702a.

Figure 8:
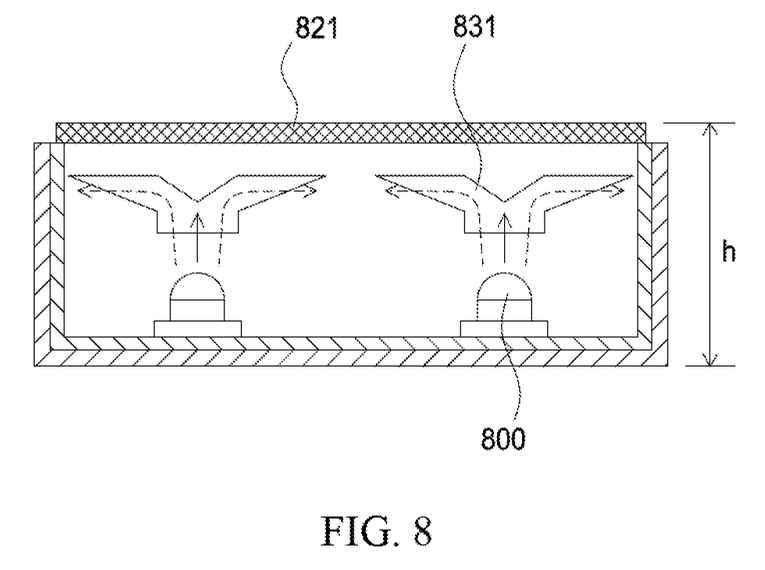
FIG. 8 shows a traditional backlight module.
Figure 9:
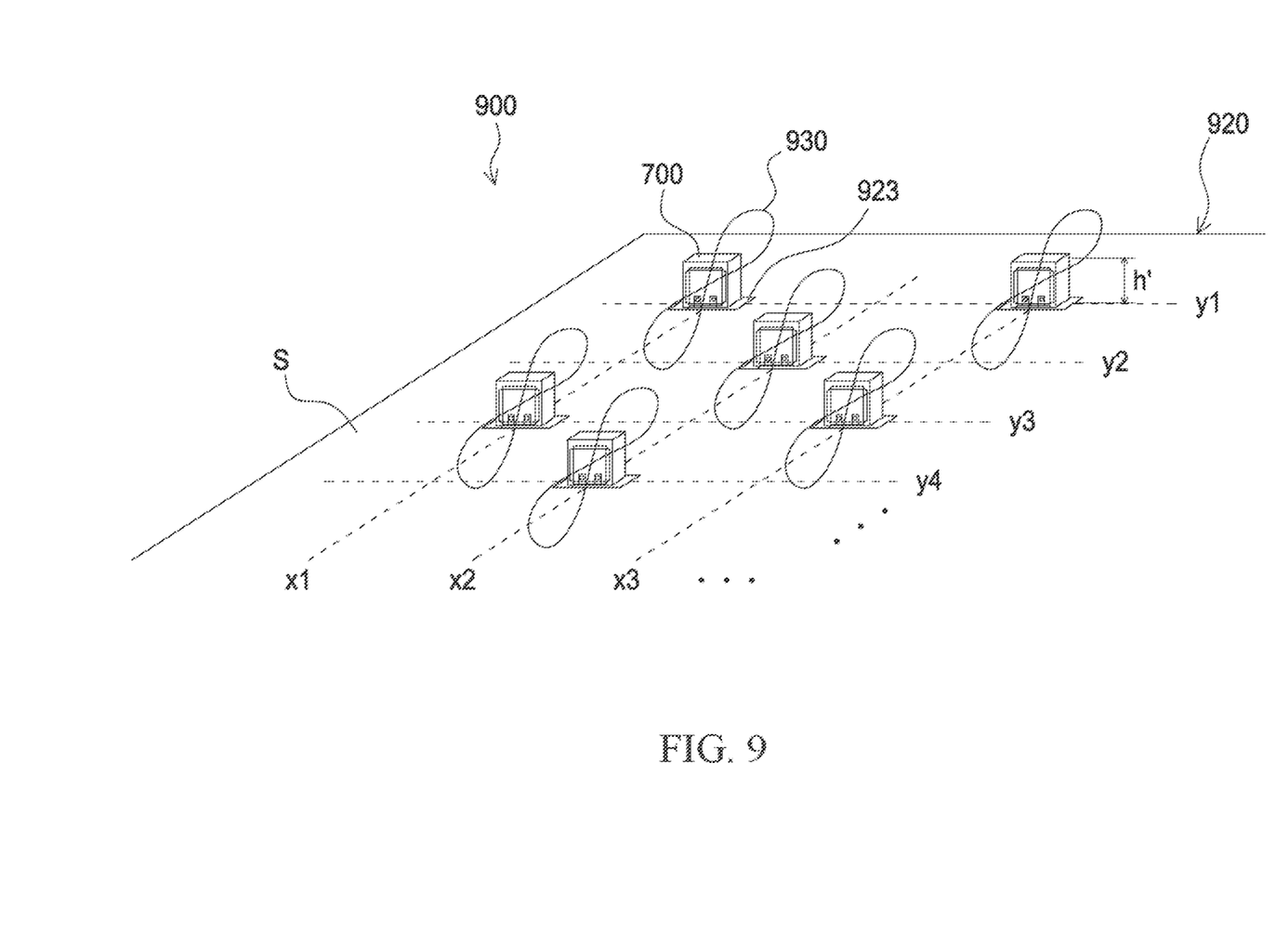
FIG. 9 shows a light-emitting device in accordance with a seventh embodiment of the present disclosure, which illustrates a backlight module comprising light-emitting devices in accordance with the embodiments of the present disclosure.

In contrast to the conventional light-emitting device, the vertical structure in the light-emitting device in accordance with the present disclosure (i.e. the major light-emitting surface of the light-emitting device is perpendicular to the upper surface of the carrier) can enhance the light intensity in a horizontal direction and alleviate the concerns about the thickness and dimension in various applications. Taking a backlight module in a display apparatus as an example, as shown in FIG. 8, the light field of a known packaged light-emitting device 800 has more light emitted in the vertical direction as the arrows with solid lines indicate in the figure. In order to achieve an uniform light distribution on the luminous surface 821, an additional optical device 831 is applied for deflecting the light emitted from the light-emitting device 800 into a horizontal direction as shown by the arrows with dotted lines in the figure, and therefore the thickness h of the backlight module is thicker and the volume thereof is increased due to the optical device 831. Contrarily, when the light-emitting device 700 as illustrated in the sixth embodiment and FIG. 7 is applied to a backlight module 900 as shown in FIG. 9 which illustrates the seventh embodiment in accordance with the present disclosure, because of the transparent substrate and the vertical structure, a greater light intensity in the horizontal direction is achieved. In FIG. 9, each light-emitting device 700 is vertically plugged into a socket 923 of a carrier 920. The light field 930 as illustrated in the figure achieves a greater light intensity and a uniform distribution in the horizontal direction by implementing the transparent substrate and the vertical structure without any additional optical device. The thickness h' of the backlight module has about the same scale as that of the LED die. The structure of the carrier 920 is substantially the same as or similar to the carrier 720 as illustrated in FIG. 7(e). It is noted that locations of light-emitting devices 700 on the carrier 920 are in an interlaced arrangement. That is, any point on the upper surface S of the carrier 920 on which the sockets 923 is located may be represented as a coordinate (xi, yj) defined by a two-dimensional Cartesian coordinate system, wherein xi and yj are the x coordinate and the y coordinate of the point respectively, and i and j are real numbers. Each light-emitting device 700 can be identified by the x coordinate of x1, x2, x3 . . . and the y coordinate of y1, y2, y3 . . . as shown in this figure. Two light-emitting devices located at the x coordinate of x1(or x3) are interlaced with two light-emitting devices located at the x coordinate of x2 in their y coordinates. That is, the two light-emitting devices located at the x coordinate of x1(or x3) have the y coordinate of y1 and y3 respectively; and the two light-emitting devices located at the x coordinate of x2 have the y coordinate of y2 and y4 respectively. In other words, there is no light-emitting device substantially disposed at position (x2, y1) while three light-emitting devices are substantially disposed at positions (x1, y1), (x2, y2), and (x3, y1) respectively. The light needed at position (x2, y1) is compensated by the light emitted by the light-emitting device disposed substantially at the position (x2, y2), and therefore the light field in the horizontal direction is more uniform by using such location arrangement.

Following, a lighting-emitting apparatus 900, such as a backlight module, in accordance with a seventh embodiment of the present disclosure is provided. The light-emitting apparatus 900 comprises a first light-emitting device, a second light-emitting device, a third light-emitting device, and a carrier 920 having a first surface S, wherein the first light-emitting device, the second light-emitting device, the third light-emitting device are disposed on the first surface S with a interlaced location disposition. A location for any point on the first surface S is represented as a coordinate (xi, yj) defined by a two-dimensional Cartesian coordinate system, wherein xi is the x coordinate and yj is the y coordinate, and both i and j are real numbers. The first, second, and third light-emitting devices are substantially disposed at positions (x1, y1), (x2, y2), and (x3, y1) respectively, and no light-emitting device is disposed at position (x2, y1).

Although different labels are used for describing elements having the same function in various embodiments, the physical, chemical, or electrical property thereof should be identical or closely similar unless a specific limitation is made in an individual embodiment. Although specific embodiments have been illustrated and described, it will be obvious to those skilled in the art that various modifications may be made without departing from what is intended to be limited solely by the appended claims.

What is claimed is:

1. A light-emitting device, comprising:
an LED die having an edge, a first electrode and a second electrode separated from the first electrode by a first distance;
a first electrode pin having a first remote end, and a first proximate end directly and electrically connected to the first electrode;
a second electrode pin having a second remote end separated from the first remote end by a second distance, and a second proximate end pin directly and electrically connected to the second electrode;
a first transparent substrate; a second transparent substrate, collaborating with the first transparent substrate to sandwich the LED die, the first proximate end, and the second proximate end in a configuration of exposing the first remote end and the second remote end; and
a package material comprising a flat surface and encapsulating the first transparent substrate, the LED die and the second transparent substrate,
wherein the first distance is substantially equal to the second distance,
wherein the first electrode pin and the second electrode pin pass through the edge, and
wherein the first electrode pin and the second electrode pin are exposed on the flat surface.

2. The light-emitting device of claim 1, wherein the package material comprises a phosphor material.

3. The light-emitting device of claim 1, wherein the first transparent substrate comprises a cavity, and the LED die is disposed in the cavity.

4. The light-emitting device of claim 1, further comprising a thermal conductive layer on at least one of the first transparent substrate and the second transparent substrate, wherein the LED die is disposed on the thermal conductive layer.

5. The light-emitting device of claim 4, wherein the thermal conductive layer contacts the first electrode pin and the second electrode pin.

6. The light-emitting device of claim 1, wherein the second transparent substrate comprises a phosphor material.

7. The light-emitting device of claim 1, further comprising a phosphor material formed on at least one of the first transparent substrate and the second transparent substrate.

8. The light-emitting device of claim 1, wherein the first electrode and the second electrode are disposed near the edge.

9. The light-emitting device of claim 1, wherein the first transparent substrate has a cuboid-like shape.

10. A light-emitting device, comprising:
an LED die with a first electrode and a second electrode separated from the first electrode by a first distance;
a first electrode pin having a first remote end, and a first proximate end directly and electrically connected to the first electrode;
a second electrode pin having a second remote end separated from the first remote end by a second distance, and a second proximate end pin directly and electrically connected to the second electrode;
a first transparent substrate;
a second transparent substrate, collaborating with the first transparent substrate to sandwich the LED die, the first proximate end, and the second proximate end in a configuration of exposing the first remote end and the second remote end; and a package material encapsulating the first transparent substrate, the LED die and the second transparent substrate, wherein the first distance is substantially equal to the second distance, and wherein the package material comprises a flat surface, and the first electrode pin and the second electrode pin are exposed on the flat surface.

11. The light-emitting device of claim 10, wherein the first transparent substrate comprises a cavity, and the LED die is disposed in the cavity.

12. The light-emitting device of claim 10, wherein the package material comprises a phosphor material.

13. The light-emitting device of claim 10, further comprising a thermal conductive layer on the first transparent substrate, the second transparent substrate, or both thereof, wherein the LED die is disposed on the thermal conductive layer.

14. The light-emitting device of claim 13, wherein the thermal conductive layer contacts the first electrode pin and the second electrode pin.

15. The light-emitting device of claim 10, wherein the second transparent substrate comprises a phosphor material.

16. The light-emitting device of claim 10, further comprising a phosphor material formed on the first transparent substrate, the second transparent substrate, or both thereof.

17. The light-emitting device of claim 10, wherein the first transparent substrate has a cuboid-like shape.

* * * * *